United States Patent [19]

Franson et al.

[11] Patent Number: 5,436,599
[45] Date of Patent: Jul. 25, 1995

[54] METHOD AND APPARATUS FOR DIGITAL MODULATION USING PULSE ADDITION

[75] Inventors: Glen A. Franson, Sleepy Hollow; Peter Nanni, Algonquin, both of Ill.

[73] Assignee: Motorola, Inc., Schaumburg, Ill.

[21] Appl. No.: 51,401

[22] Filed: Apr. 23, 1993

[51] Int. Cl.$^6$ .................. H03C 3/09; H04L 27/12
[52] U.S. Cl. .................. 332/101; 332/127; 331/23; 375/306
[58] Field of Search ............ 332/100, 101, 102, 127; 375/45, 62, 65; 331/23

[56] References Cited

U.S. PATENT DOCUMENTS

| | | | |
|---|---|---|---|
| 4,471,328 | 9/1984 | Chapman | 332/112 |
| 4,573,026 | 2/1986 | Curtis et al. | 332/124 |
| 4,862,108 | 8/1989 | Cutler | 331/9 |
| 4,901,036 | 2/1990 | Herold et al. | 331/25 |
| 4,926,141 | 5/1990 | Herold et al. | 331/16 |
| 5,289,141 | 2/1994 | Nanni et al. | 332/101 |

OTHER PUBLICATIONS

Don L. Cannon et al, Designing with Microprocessors Lesson Summaries, p. 92, ©1975.

*Primary Examiner*—Andrew M. Dolinar
*Attorney, Agent, or Firm*—Kelly A. Gardner; John H. Moore

[57] ABSTRACT

An apparatus for generating output signals having predetermined frequency shifts relative to a frequency provided by a reference signal is included in a system (500) comprising a phase-locked loop (206) coupled to the reference signal for generating the first and second output signals. The apparatus comprises pulse addition circuitry (204) coupled to the reference signal and the phase-locked loop (206) for adding pulses to the reference signal at a first cyclical rate to generate the first output signal and for adding pulses to the reference signal at a second cyclical rate to generate the second output signal.

20 Claims, 4 Drawing Sheets

METHOD AND APPARATUS FOR DIGITAL MODULATION USING PULSE ADDITION

FIELD OF THE INVENTION

This invention relates in general to modulators for radio frequency transmitters, and more specifically to a method and apparatus for digital modulation using pulse addition.

BACKGROUND OF THE INVENTION

Conventional FM transmitters using phase-locked loops (PLLs) to generate a high frequency carrier signal having its frequency synchronized by a substantially lower frequency input reference signal are well-known in the art. An inherent characteristic of a PLL is a low-pass filter in the loop that allows the loop to track long-term, slow variation of the frequency of the input reference signal, but prevents tracking high frequency changes, such as jitter, in the input reference signal. From the point of view of modulating the output, i.e., voltage controlled oscillator (VCO), side of the PLL, the loop characteristics permit high frequency modulation of the output, e.g., voice modulation, but prevent low frequency or DC modulation such as required to transmit asymmetrical data or to permanently offset the carrier frequency. To do both high and low frequency modulation, conventional transmitters have used a two-port modulation technique to simultaneously apply a modulating signal to both the PLL VCO and to a reference modulator for modulating the input reference signal.

Conventional reference modulators have used a pulse addition technique to increase the input reference frequency and a pulse subtraction technique to lower the input reference frequency. Because the required amount of modulation was a small fraction of the carrier frequency, the rate of pulse addition or subtraction was very low, e.g., sixty Hz. The very low pulse rate caused very low frequency spurious signals that had to be removed by the low-pass filter of the PLL to prevent the spurious signals from modulating the carrier. Adequate attenuation of the very low frequency spurious signals required an extremely low frequency cut-off, e.g., five Hz, for the low-pass filter of the PLL. Unfortunately, a five Hz PLL low-pass filter produced a PLL lock time that was too long to meet requirements for a frequency agile transmitter, i.e., a transmitter capable of being switched quickly to different pre-determined frequencies on demand.

To overcome the problem of an overly long lock time, manufacturers of conventional transmitters constructed the transmitters using two PLLs—one PLL having a very low cut-off frequency for filtering the very low frequency spurious signals and the other PLL having a moderate cut-off frequency for providing a sufficiently fast lock time when changing to a new frequency. While this dual PLL approach solved the lock time problem and provided DC and low frequency modulation capability, the approach was a costly one, because it doubled the number of PLLs and the space required therefor.

Thus, what is needed is a way of providing DC and low frequency modulation in an FM transmitter without a resultant overly slow PLL lock time and without the requirement for two costly PLLs.

SUMMARY OF THE INVENTION

According to a first aspect of the present invention, a method for generating first and second output signals having predetermined frequency shifts relative to a frequency provided by a reference signal in a system comprising a phase-locked loop coupled to the reference signal for generating the first and second output signals comprises the steps of adding pulses to the reference signal at a first cyclical rate to generate the first output signal without concurrently subtracting pulses from the reference signal and adding pulses to the reference signal at a second cyclical rate to generate the second output signal without concurrently subtracting pulses from the reference signal.

According to a second aspect of the present invention, an apparatus for generating first and second output signals having predetermined frequency shifts relative to a frequency provided by a reference signal is included in a system comprising a phase-locked loop coupled to the reference signal for generating the first and second output signals. The apparatus comprises pulse addition circuitry coupled to the reference signal and the phase-locked loop for adding pulses to the reference signal at a first cyclical rate to generate the first output signal without concurrently subtracting pulses from the reference signal and for adding pulses to the reference signal at a second cyclical rate to generate the second output signal without concurrently subtracting pulses from the reference signal.

DESCRIPTION OF A PREFERRED EMBODIMENT

Figure 1:
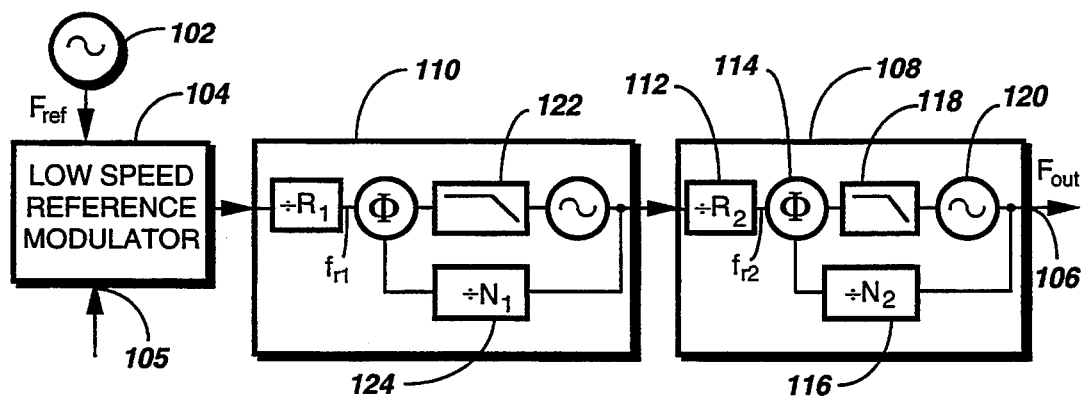
FIG. 1 is an electrical block diagram of a conventional frequency synthesizer having a conventional low speed reference modulator.

With reference to FIG. 1, an electrical block diagram of a conventional frequency synthesizer 100 having a conventional low speed reference modulator 104 for a frequency modulation (FM) transmitter comprises a reference frequency generator 102, which generates a moderately high frequency, e.g., 14.4 MHz, output signal, referred to as $F_{ref}$. The output signal from the reference frequency generator 102 is coupled to the low speed reference modulator 104 for modulating the output signal in response to data symbols received at a data input 105. Because of the high carrier frequency desired at an output 106 of the frequency synthesizer 100, e.g., 930 MHz, frequency multiplication circuitry comprising a second phase-locked loop (PLL) 108 is coupled to the reference modulator 104. A first PLL 110, coupled between the low speed reference modulator 104 and the second PLL 108, will be discussed herein below following a discussion of the second PLL 108. The second PLL 108 comprises a conventional reference divider 112 for dividing the output signal from the low speed reference modulator 104. The second PLL 108 further comprises a phase comparator 114 coupled to an output of the reference divider 112, which has a division factor of $R_2$, and to a divider 116 having a division factor $N_2$ driven by the carrier frequency at the output 106 of the frequency synthesizer 100. The phase comparator 114 generates an error signal, which is coupled through a low pass filter 118 to a voltage controlled oscillator (VCO) 120 for generating the carrier frequency at the output 106. Operation of the second PLL 108 is such that the carrier frequency at the output 106 tracks the frequency of the output signal of the low speed reference modulator 104, divided by the division factor $R_2$ of the reference divider 112 and multiplied by the division factor $N_2$ of the divider 116. In a frequency-agile transmitter, the division factor $N_2$ of the divider 116 is preferably adjusted to adjust the carrier frequency.

The conventional low speed reference modulator 104 operates by adding pulses into the output signal of the reference frequency generator 102 to increase the carrier frequency at the output 106 of the frequency synthesizer 100. Conversely, the conventional low speed reference modulator 104 subtracts pulses from the output signal of the reference frequency generator 102 to decrease the carrier frequency at the output 106 of the frequency synthesizer 100. Conventional circuits and techniques for performing pulse addition and subtraction are taught in U.S. Pat. No. 4,471,328 to Chapman, which is assigned to the assignee of the present invention, and which is hereby incorporated by reference herein.

Typically the amount of frequency increase or decrease required to be done by the conventional low speed reference modulator 104 is small, e.g., a positive 4,000 Hz carrier offset, thus requiring a very low frequency rate of pulse addition or pulse subtraction. Continuing with the previous example, because of the frequency multiplication provided by the PLL 108, a positive 4,000 Hz carrier offset for a carrier frequency of 930 MHz would require only a 62 Hz rate of pulse addition by the low speed reference modulator 104 when the reference frequency provided by the reference frequency generator 202 is 14.4 MHz.

A 62 Hz rate of pulse addition produces not only the desired carrier frequency offset at the output 106 of the frequency synthesizer 100, but also will produce spurious 62 Hz modulation of the carrier frequency if signals at the 62 Hz pulse addition rate are allowed to reach the VCO 120 unattenuated. Preferably, an attenuation of at least fifty dB at 62 Hz is required relative to the gain presented to a signal at the reference frequency of 14.4 MHz.

It would be possible to design the PLL 108 to produce the preferred attenuation of fifty dB at 62 Hz by designing the low pass filter 118 to have an extremely low natural loop corner frequency of approximately five Hz. Unfortunately, as discussed briefly in the background section herein above, a natural loop corner frequency of five Hz produces a lock time of typically 455 milliseconds—about ten times longer than is preferred for a frequency-agile transmitter.

Consequently, the conventional frequency synthesizer 100 is constructed with the two PLLs 108, 110. The low pass filter 118 of the second PLL 108 is designed with a natural loop corner frequency high enough, e.g., 50 Hz, to provide a fast enough (approximately 45.5 msec.) lock time during frequency changes, which may be effected by changing the division factor of the divider 116. The first PLL 110 is designed with a low pass filter 122 having an extremely low natural loop corner frequency, e.g., five Hz. The extremely low natural loop corner frequency of the low pass filter 122 provides the required amount of attenuation of the very low frequency pulse addition or pulse subtraction signals. A resultant long lock time of the first PLL 110 is of little consequence, because the division factor of the divider 124 is not varied to adjust the output frequency.

While the technique of using two PLLs has been able to achieve both a fast enough lock time and sufficient attenuation of the pulse addition and subtraction signals, this technique has also been costly in terms of both component cost and space requirements for accommodating the additional PLL. It would be highly desirable to find a way to achieve both a fast enough lock time and sufficient attenuation of the pulse addition and subtraction signals using a single PLL.

Figure 2:
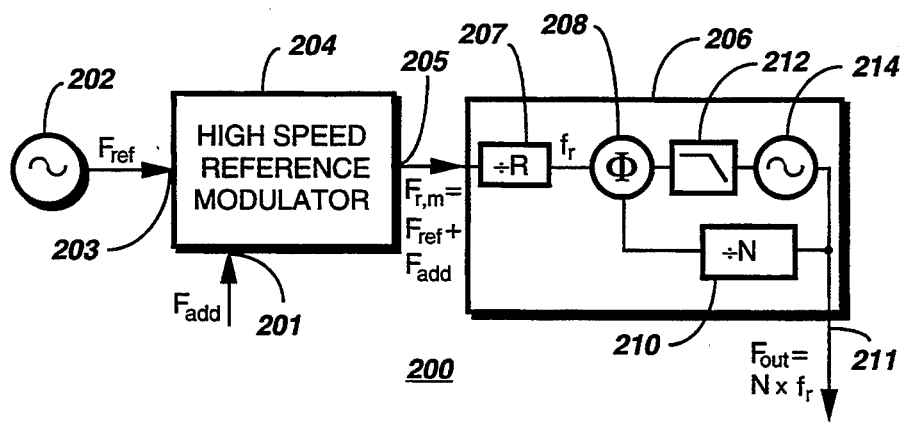
FIG. 2 is an electrical block diagram of a frequency synthesizer having a high speed reference modulator in accordance with the preferred embodiment of the present invention.

With reference to FIG. 2, an electrical block diagram of a frequency synthesizer 200 for an FM transmitter having a high speed reference modulator 204 in accordance with a preferred embodiment of the present invention comprises a reference frequency generator 202, which generates a moderately high frequency, e.g., 14.4 MHz, output signal, referred to as $F_{ref}$. The output signal from the reference frequency generator 202 is coupled to an input line 203 of the high speed reference modulator 204 for modulating the output signal of the reference frequency generator 202 in response to a pulse insertion signal, referred to as $F_{add}$, received at input 201. A phase-locked loop (PLL) 206 is coupled to the high speed reference modulator 204 by an output line 205 of the high speed reference modulator 204.

The PLL 206 comprises a reference divider 207 coupled to the high speed reference modulator 204 for receiving the modulated reference frequency and for dividing the modulated reference frequency by an integer R, resulting in an output having a frequency given by the formula $f_r = (F_{ref} + F_{add})/R$ and driven by the channel spacing. Preferably, R is selected such that the output, $f_r$, of the reference divider 207 has a frequency of approximately 5 kHz or 6.25 kHz, values which are standard in the art.

The PLL 206 further comprises a phase comparator 208 coupled to the reference divider 207 and to a divider 210, which has a division factor driven by the carrier frequency at the output 211 of the PLL 206. The phase comparator 208 generates an error signal, which is coupled through a low pass filter 212 to a voltage controlled oscillator (VCO) 214 for generating the carrier frequency at the output 211. Operation of the PLL 206 is such that the carrier frequency at the output 211 tracks the frequency of the output of the high speed reference modulator 204, divided by the integer R and multiplied by the division factor N of the divider 210. In a frequency-agile transmitter, either the division factor R of the reference divider 207 or the division factor N of the divider 210, or both, may be adjusted to adjust the carrier frequency. However, it is preferable to adjust the division factor N for frequency adjustments, while the division factor R of the reference divider 207 is set to yield a frequency $f_r$ of approximately 5 kHz or 6.25 Hz.

While the architecture of the PLL 206 is similar to the conventional PLL 110 (FIG. 1), the natural loop corner frequency of the low pass filter 212 is substantially, e.g., ten times, higher than the natural loop corner frequency of the low pass filter 122 (FIG. 1) of the PLL 110. The substantially higher natural loop corner frequency provides a sufficiently fast lock time to allow the PLL 206 to be used alone for frequency-agile applications.

Components utilized in constructing the PLL 206 are preferably as follows:

| reference divider 207 | part of MC145170 |
|---|---|
| phase comparator 208 | part of MC145170 |
| divider 210 | part of MC145170 |
| VCO 214 | TTD1732A |
| reference frequency generator 202 | KXN-1096A |

The above components are available from Motorola, Inc. of Schaumburg, Ill.

The low pass filter 212 is a discrete first order filter comprising a resistor (not shown) coupled between an error signal output of the phase comparator 208 and a frequency controlling input of the VCO 214. The filter 212 further comprises a capacitor (not shown) coupled between the frequency controlling input of the VCO 214 and circuit ground. Other components and circuit architectures may be used as well in accordance with the present invention.

A key component of the frequency synthesizer 200 that enables the use of the substantially higher natural loop frequency in the PLL 206 is the high speed reference modulator 204 in accordance with the preferred embodiment of the present invention. Unlike conventional low speed reference modulators, such as the one depicted in FIG. 1, the high speed reference modulator 204 does not utilize low frequency (near 60 Hz) pulse addition and subtraction techniques. Instead, the high speed reference modulator 204 utilizes only pulse addition, i.e., the insertion of pulses into the reference signal, on the order of 3-6 kHz, which are preferably high enough in frequency to be attenuated by the low pass filter 212, which may, for example, develop 50 dB of attenuation at 500 Hz.

In a conventional frequency synthesizer, the use of pulse addition at these frequencies (3-6 kHz) would produce too much change in the reference frequency, resulting in over modulation of the carrier frequency. In the frequency synthesizer 200 in accordance with the present invention, however, positive deviation of a center frequency occurs when pulses are added to the high speed reference modulator 204 at a first high rate, and negative deviation of the center frequency occurs when pulses are added at a second high rate slower than the first rate. In addition to providing for the use of a single PLL 206, the high speed reference modulator 204, which only adds pulses, utilizes much simpler circuitry than the low speed reference modulator 104 (FIG. 1), which both adds and subtracts pulses from the reference frequency.

As described above, the high speed reference modulator 204 modulates a reference frequency, $F_{ref}$, with a pulse insertion signal, $F_{add}$. Therefore, the modulated reference frequency is given by the equation $$F_{r,m} = F_{ref} + F_{add}.$$

The modulated reference frequency is thereafter provided to the reference divider, the output, $f_r$, of which is given by $$f_r = F_{r,m}/R.$$

The frequency synthesizer 200 then, through use of the PLL 206, generates an output frequency $F_{out}$, which is offset from the carrier frequency, $F_c$, programmed in to the frequency synthesizer 200 by an offset frequency $\Delta f$, i.e., $$F_{out} = F_c + \Delta f,$$

where the offset frequency, $\Delta f$, is an integer multiple of the reference frequency, $F_{ref}$, divided by R.

The positive and negative pulse insertion rates, i.e., the pulse insertion signals provided to the high speed reference modulator 204 for positive and negative deviation of the carrier in a two-level system, are defined by the following equations:

$$F_{add}^{(+)} = \frac{(\Delta f + f_{dev}) F_{ref}}{F_c} \text{ and } F_{add}^{(-)} = \frac{(\Delta f - f_{dev}) F_{ref}}{F_c},$$

wherein $f_{dev}$ is indicative of a desired carrier deviation.

Calculations based upon the preceding formulas follow for an example FM transmitter for receiving binary signals.

Assumptions:
Synthesizer output frequency ($F_{out}$) = 930 MHz
Desired carrier frequency deviation ($f_{dev}$) = +/−4 kHz
Reference frequency ($F_{ref}$) = 14.4 MHz
Frequency offset ($\Delta f$) = 40 × 6250 Hz = 250 kHz
Output of reference divider 207 ($F_{ref}/R$) = 6250 Hz
Calculations:
Carrier frequency:

$$F_c = 930 \text{ MHz} - 250 \text{ kHz} = 929.75 \text{ MHz}$$

Positive pulse insertion rate:

$$F_{add}^{(+)} = \frac{(250 \text{ kHz} + 4 \text{ kHz}) \, 14.4 \text{ MHz}}{929.75 \text{ MHz}} = 3933.9607 \text{ Hz}$$

Negative pulse insertion rate:

$$F_{add}^{(-)} = \frac{(250 \text{ kHz} - 4 \text{ kHz}) \, 14.4 \text{ MHz}}{929.75 \text{ MHz}} = 3810.0565 \text{ Hz}$$

Therefore, pulse insertion rates of 3933.9607 Hz and 3810.0565 Hz would be provided to the high speed reference modulator 204 for transmission of mark and space symbols using frequency shift-keyed (FSK) modulation. The mark and space symbols are symbols representing two different signals, such as binary 1's and 0's.

Although the design example recited hereinabove describes, for illustrative purposes only, the use of two different pulse insertion rates to perform two-level modulation, it will be appreciated by one of ordinary skill in the art that a greater number of pulse insertion rates can be utilized to modulate the carrier frequency for multi-level applications. By way of example, for four-level communication, the high speed reference modulator 204 could utilize a first two pulse insertion rates calculated from a first desired carrier deviation and a second two pulse insertion rates calculated from a second desired carrier deviation. According to the present invention, therefore, the high speed reference modulator 204 can be easily and conveniently adjusted to provide for modulation of the carrier frequency in multi-level communication systems.

Figure 3:
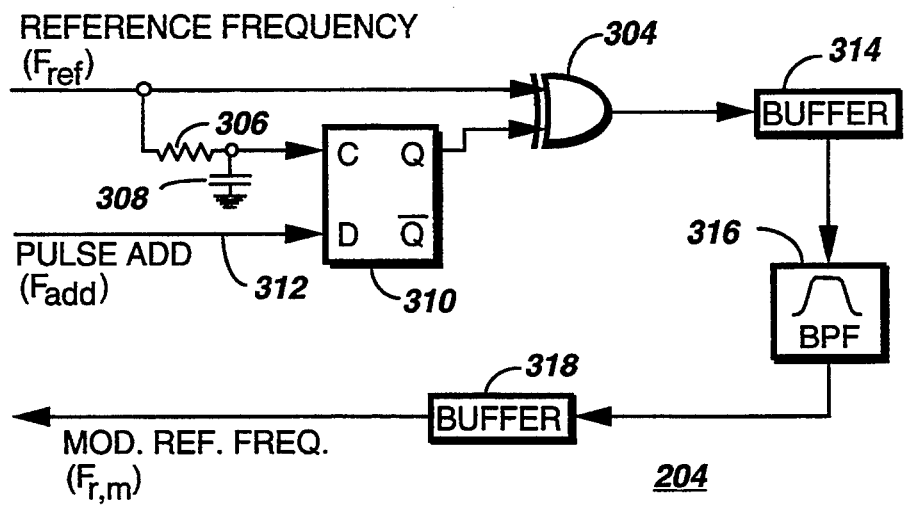
FIG. 3 is an electrical block diagram of the high speed reference modulator of FIG. 2 in accordance with the preferred embodiment of the present invention.

Referring next to FIG. 3, an electrical block diagram of the high speed reference modulator 204 is depicted. In accordance with the preferred embodiment of the present invention, the reference frequency is provided by the reference frequency generator 202 to a first input of an Exclusive Or (Ex-Or) gate 304. Additionally, the reference frequency is delayed by delay circuitry, comprising a resistor 306 and a capacitor 308, and provided to a clock (C) input of a D Flip-Flop 310. A pulse add line 312 provides pulses at different insertion rates, as described above, to the D input of the D Flip-Flop 310. The Q output is coupled to a second input of the Ex-Or gate 304. The $\overline{Q}$ output of the D Flip-Flop 310 is not used. The output of the Ex-Or gate 304 is taken to a first buffer 314, from which it is provided to a bandpass filter 316, which is preferably a crystal filter, and a second buffer 318.

It may be appreciated by one of ordinary skill in the art that the bandpass filter 316 has a center frequency and bandwidth such that the frequencies $F_{ref}+F_{add}(-)$ and $F_{ref}+F_{add}(+)$ are passed. Additionally, frequencies less than or equal to $F_{ref}-F_{add}(-)$ and frequencies greater than or equal to $F_{ref}+3F_{add}(-)$ are attenuated.

Figure 4:
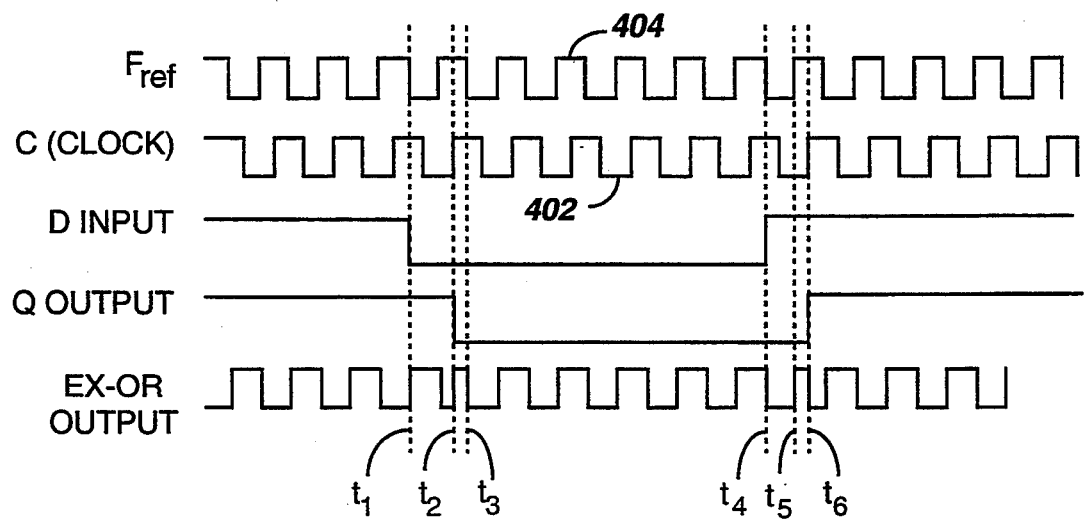
FIG. 4 is a timing diagram depicting the operation of the high speed reference modulator of FIG. 3 in accordance with the preferred embodiment of the present invention.

With reference to FIG. 4, a timing diagram depicting the operation of the high speed reference modulator 204 is shown in which the vertical axis represents the amplitude of the illustrated pulses and the horizontal axis represents times for the reference frequency input, $F_{ref}$, the clock input, the D input, and the Q output of the D Flip-Flop 310, and the output of the Ex-Or gate 304.

As may be seen from the figure, the clock waveform 402 is delayed with respect to the reference frequency waveform 404 by the delay circuitry of FIG. 3. When the D input goes low, at time $t_1$, the Q output of the D Flip-Flop 310 goes low, at time $t_2$, at the next rising edge of the clock. Because, at this time, the reference frequency is high and the Q output is low, the output of the Ex-Or gate 304 goes high until $t_3$, when the reference frequency goes low. Subsequently, when the D input again goes high, at time $t_4$, the Q output of the D Flip-Flop 310 goes high, at $t_5$, at the next rising edge of the clock. Because, at this time, the reference frequency is high and the Q output is high, the output of the Ex-Or gate 304 goes low until $t_6$, when the refernece frequency goes low. In this manner, each transition of the waveform applied at the D input adds one-half pulse to the Ex-Or output signal. Stated another way, an additional pulse is added to the Ex-Or output for each cycle of the waveform applied to the D input of the D Flip-Flop 310.

Figure 5:
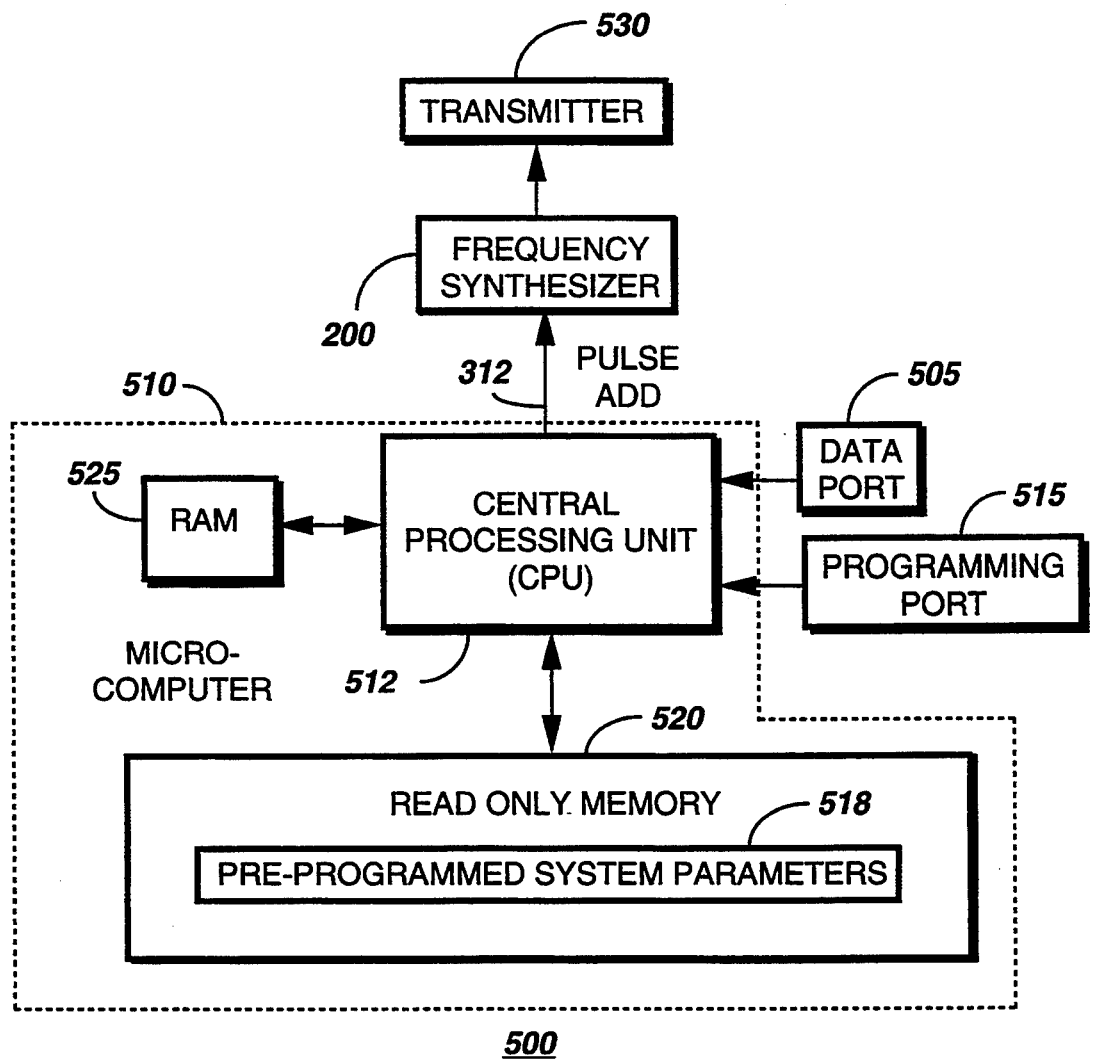
FIG. 5 is an electrical block diagram of a radio communication device which includes the frequency synthesizer of FIG. 2 in accordance with the preferred embodiment of the present invention.

FIG. 5 is an electrical block diagram of a radio communication device 500, such as an FM transmitter, which includes the high speed reference modulator 204 (FIG. 2) in accordance with the preferred embodiment of the present invention. The radio communication device 500, by way of example, comprises a data port 505 for receiving and providing data symbols to a microcomputer 510, such as an MC68HC11 manufactured by Motorola, Inc. of Schaumburg, Ill., which comprises a central processing unit (CPU) 512 for controlling the operation of the microcomputer 510. A programming port 515 is coupled to the microcomputer 510 for providing system parameters 518 to the CPU 512. The system parameters 518 are, for instance, carrier frequency, reference frequency, desired frequency deviation, etc. The CPU 512 stores the system parameters 518 in a read only memory (ROM) 520, which stores constants and subroutines necessary to the operation Of the microcomputer 510. Additionally, a random access memory (RAM) 525 internal to the microcomputer 510 for temporarily stores values computed during operation.

Preferably, the CPU 512 generates pulse insertion signals in accordance with the received data symbols, although it may be appreciated that the pulse insertion signals could alternatively be generated by other circuitry capable of performing the same operations. As described above, the pulse insertion signals are provided, via a pulse add line 312, to the frequency synthesizer 200, in response to which the high speed reference modulator 204 internal to the frequency synthesizer 200 modulates the reference frequency and the PLL 206 coupled to the high speed reference modulator 204 generates the output signal. A transmitter 530 included in the radio communication device 500 thereafter transmits the output signal in a manner well known to one of ordinary skill in the art.

Figure 6:
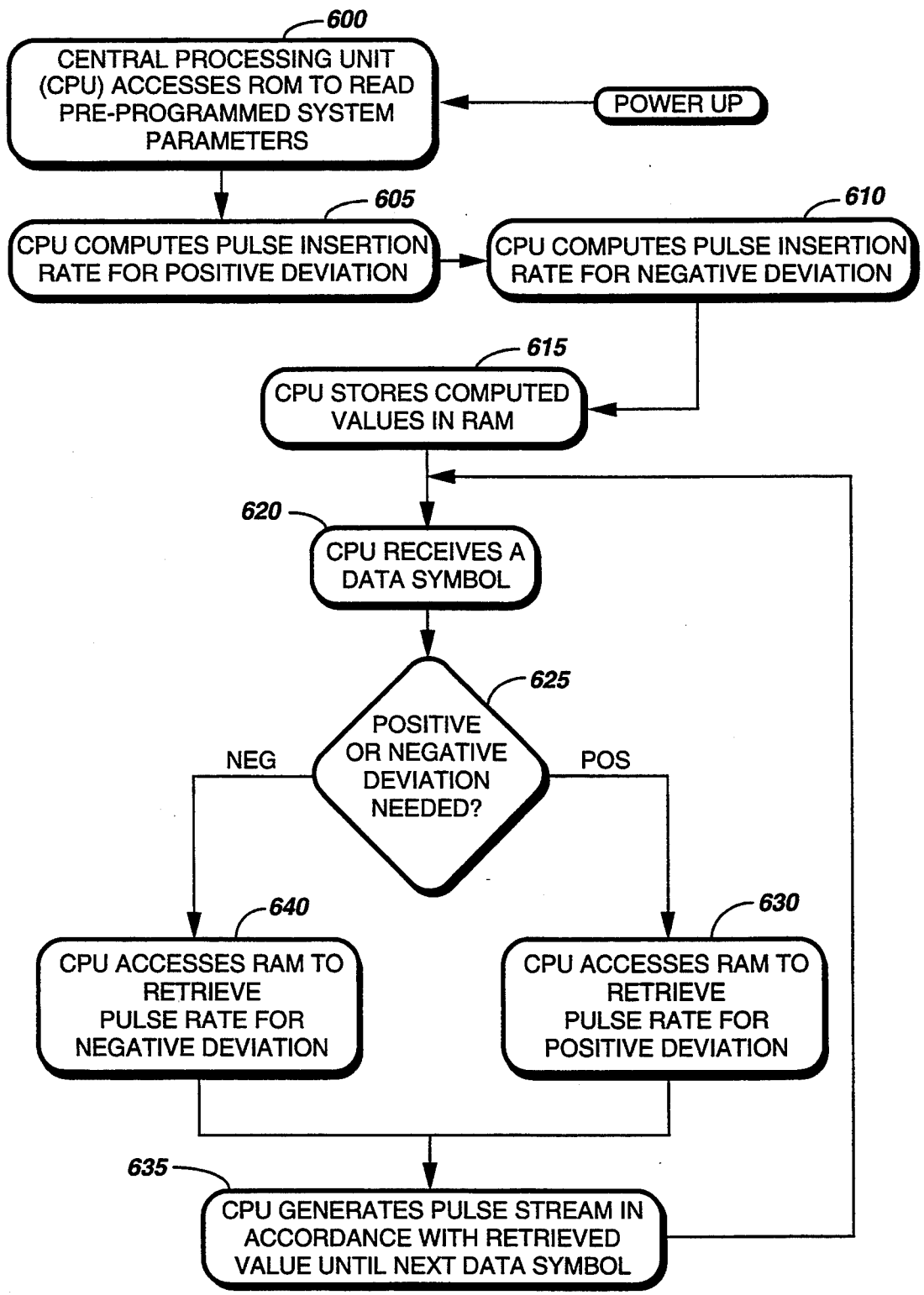
FIG. 6 is a flowchart illustrating the operation of the CPU included in the radio communication device of FIG. 5 in accordance with the preferred embodiment of the present invention.

Referring next to FIG. 6, a flowchart illustrates the operation of the CPU 512 (FIG. 5) in accordance with the preferred embodiment of the present invention. After power-up of the radio communication device 500, the CPU 512 accesses, at step 600, the ROM 520 to read selected ones of pre-programmed system parameters 518, e.g., a carrier frequency value, a frequency offset value, a frequency deviation value, a reference frequency value, etc. For simplicity, in the following description, the high speed reference modulator 204 utilizes two-level FSK modulation, although, in alternate embodiments, multi-level FSK may be utilized when additional parameters are calculated and stored for additional levels of modulation.

The CPU 512 next utilizes the selected ones of the pre-programmed system parameters 518 to compute, at steps 605, 610, the pulse insertion rates necessary for modulation of the reference frequency provided to the frequency synthesizer 200. The computed values are thereafter, at step 615, stored in the RAM 525. When, at step 620, a data symbol is received, the CPU 512 determines, at step 625, whether the carrier deviation required by the data symbol is negative or positive. When the required carrier deviation is positive, the CPU 512 retrieves, at step 630, the positive deviation value stored in the RAM 525 and, at step 635, generates in accordance therewith a pulse stream until the next data symbol is received, at step 620. Similarly, when the required carrier deviation is negative, the CPU 512 retrieves, at step 640, the stored negative deviation value for generation of an appropriate pulse stream in a manner well known to one of ordinary skill in the art.

Thus, the present invention provides DC and low frequency modulation in an FM transmitter without a result overly-slow PLL lock time and without the requirement for two PLLs. Because pulses are added to a reference frequency at rates on the order of 3–6 kHz, the pulse rates can be filtered easily by a standard low pass filter in the PLL of the radio communication device. Additionally, the low pass filter is not required to have an extremely low natural loop corner frequency, which, as described above, results in an overly long lock time after a frequency change. Finally, because pulse subtraction is eliminated altogether, circuitry included in the high speed reference modulator is simpler than that of conventional reference modulators. Therefore, the present invention provides a substantial cost savings over conventional reference modulators for use in radio communication devices, such as FM transmitters.

What is claimed is:

1. A method for generating first and second output signals having predetermined frequency shifts relative to a frequency provided by a reference signal in a system comprising a phase-locked loop coupled to the reference signal for generating the first and second output signals, the method comprising the steps of:
   (a) adding pulses to the reference signal at a first cyclical rate to generate the first output signal without concurrently subtracting pulses from the reference signal; and
   (b) adding pulses to the reference signal at a second cyclical rate to generate the second output signal without concurrently subtracting pulses from the reference signal.

2. The method according to claim 1, further comprising the step of:
   (c) selecting the first and second cyclical rates to be greater than a rate determined by frequency response characteristics of the phase-locked loop.

3. The method according to claim 1, wherein:
   step (a) occurs in response to the step of:
     (d) receiving a first data symbol; and
   step (b) occurs in response to the step of:
     (e) receiving a second data symbol different from the first data symbol.

4. An apparatus for generating first and second output signals having predetermined frequency shifts relative to a frequency provided by a reference signal in a system comprising a phase-locked loop coupled to the reference signal for generating the first and second output signals, the apparatus comprising:
   pulse addition means coupled to the reference signal and the phase-locked loop for adding pulses to the reference signal at a first cyclical rate to generate the first output signal, without concurrently subtracting pulses from the reference signal, and for adding pulses to the reference signal at a second cyclical rate to generate the second output signal, without concurrently subtracting pulses from the reference signal.

5. The apparatus according to claim 4, further comprising:
   receiving means coupled to the pulse addition means for receiving first and second data symbols, wherein the pulse addition means adds pulses to the reference signal at the first cyclical rate in response to reception of the first data symbol, and wherein the pulse addition means adds pulses to the reference signal at the second cyclical rate in response to reception of the second data symbol.

6. The apparatus according to claim 4, further comprising processing means coupled to the pulse addition means for selecting the first and second cyclical rates to be greater than a rate determined by frequency response characteristics of the phase-locked loop.

7. The apparatus according to claim 6, wherein the processing means comprises means for generating first and second pulse insertion signals.

8. The apparatus according to claim 7, wherein the pulse addition means comprises:
   a high speed reference modulator for receiving the reference signal and the first and second pulse insertion signals, wherein pulses are added to the reference signal at the first cyclical rate in response to reception of the first pulse insertion signal and pulses are added to the reference signal at the second cyclical rate in response to reception of the second pulse insertion signal.

9. The apparatus according to claim 7, wherein the pulse addition means comprises:
   delay circuitry for receiving the reference signal and generating therefrom a delayed reference signal;
   a D Flip-Flop having a first input for receiving the delayed reference signal, a second input for receiving the first and second pulse insertion signals, and an output for generating a docked signal in accordance therewith; and
   an Exclusive-Or gate coupled to the D Flip-Flop having a first input for receiving the reference signal, a second input for receiving the clocked signal, and an output for generating first and second modulated reference signals, wherein the first and second modulated reference signals are processed by the phase-locked loop to generate the first and second output signals.

10. The apparatus according to claim 4, further comprising:
    programming means for receiving system parameters; and
    processing means coupled to the programming means and the pulse addition means for computing the first and second cyclical rates in accordance with the system parameters.

11. The apparatus according to claim 10, further comprising:
    memory means coupled to the programming means and the processor means for storing the system parameters and the first and second cyclical rates computed therefrom.

12. The apparatus according to claim 11, wherein the memory means comprises:
    a read only memory for storing the system parameters; and
    a random access memory for temporarily storing the first and second cyclical rates computed from the system parameters.

13. A radio communication device for transmitting first and second radio frequency signals, the radio communication device comprising:
    a reference frequency generator for generating a reference signal having a predetermined frequency;
    a reference modulator coupled to the reference frequency generator for adding pulses to the reference signal at a first cyclical rate to generate a first modulated reference signal, without concurrently subtracting pulses from the reference signal, and for adding pulses to the reference signal at a second cyclical rate to generate a second modulated reference signal, without concurrently subtracting pulses from the reference signal; and
    a phase-locked loop coupled to the reference modulator for generating the first radio frequency signal in response to reception of the first modulated reference signal and for generating the second radio frequency signal in response to reception of the second modulated reference signal, wherein the first and second radio frequency signals have predetermined frequency shifts relative to the frequency of the reference signal.

14. The radio communication device according to claim 13, further comprising a processing unit coupled to the reference modulator for selecting the first and second cyclical rates to be greater than a rate determined by frequency response characteristics of the phase-locked loop.

15. The radio communication device according to claim 13, further comprising:
   a data port for receiving first and second data symbols; and
   a processing unit coupled to the data port for generating a first pulse insertion signal in response to reception of the first data symbol and for generating a second pulse insertion signal in response to reception of the second data signal.

16. The radio communication device according to claim 15, wherein the reference modulator comprises means for receiving the first and second pulse insertion signals, wherein pulses are added to the reference signal at the first cyclical rate in response to reception of the first pulse insertion signal, and wherein pulses are added to the reference signal at the second cyclical rate in response to reception of the second pulse insertion signal.

17. The radio communication device according to claim 16, wherein the reference modulator comprises:
   delay circuitry for receiving the reference signal and generating therefrom a delayed reference signal;
   a D Flip-Flop having a first input for receiving the delayed reference signal, a second input for receiving the first and second pulse insertion signals, and an output for generating a clocked signal in accordance therewith; and
   an Exclusive-Or gate coupled to the D Flip-Flop having a first input for receiving the reference signal, a second input for receiving the clocked signal, and an output for generating the first and second modulated reference signals.

18. The radio communication device according to claim 13, further comprising:
   a programming port for receiving system parameters; and
   a processing unit coupled to the programming port and the reference modulator for computing the first and second cyclical rates in accordance with the system parameters.

19. The radio communication device according to claim 18, further comprising:
   memory means coupled to the programming port and the processing unit for storing the system parameters and the first and second cyclical rates computed therefrom.

20. The radio communication device according to claim 19, wherein the memory means comprises:
   a read only memory for storing the system parameters; and
   a random access memory for temporarily storing the first and second cyclical rates computed from the system parameters.

* * * * *

UNITED STATES PATENT AND TRADEMARK OFFICE
CERTIFICATE OF CORRECTION

PATENT NO. : 5,436,599
DATED : July 25, 1995
INVENTOR(S) : Glen A. Franson, et. al It is certified that error appears in the above-indentified patent and that said Letters Patent is hereby corrected as shown below:

Column 10, line 21, delete "docked" and insert --clocked--.

Signed and Sealed this

Twelfth Day of December, 1995

*Attest:*

BRUCE LEHMAN

*Attesting Officer*      *Commissioner of Patents and Trademarks*